United States Patent
Kim et al.

(10) Patent No.: US 8,213,722 B2
(45) Date of Patent: Jul. 3, 2012

(54) METHOD FOR INSPECTING CRITICAL DIMENSION UNIFORMITY AT HIGH SPEED MEASUREMENT

(75) Inventors: Hee-Bom Kim, Seoul (KR); Myoung-Soo Lee, Gyeonggi-do (KR); Young-Su Sung, Gyeonggi-do (KR)

(73) Assignee: SAmsung Electronics Co., Ltd. (KR)

( * ) Notice: Subject to any disclaimer, the term of this patent is extended or adjusted under 35 U.S.C. 154(b) by 484 days.

(21) Appl. No.: 12/607,238

(22) Filed: Oct. 28, 2009

(65) Prior Publication Data

US 2010/0111427 A1    May 6, 2010

(30) Foreign Application Priority Data

Nov. 4, 2008  (KR) .................. 10-2008-0108789

(51) Int. Cl.
*G06K 9/68* (2006.01)

(52) U.S. Cl. ............ 382/218; 382/144; 382/154; 430/5; 430/30

(58) Field of Classification Search .................. 382/218, 382/141–154; 430/5, 30; 356/237.1–237.5, 356/625, 634–635
See application file for complete search history.

(56) References Cited

U.S. PATENT DOCUMENTS

| 7,865,866 | B2 * | 1/2011 | Kim et al. | 716/50 |
| 2006/0147818 | A1 * | 7/2006 | Lee | 430/5 |
| 2008/0260234 | A1 * | 10/2008 | Yamashita | 382/144 |

FOREIGN PATENT DOCUMENTS

| JP | 2005-285898 | 10/2005 |
| KR | 1020050063325 A | 6/2005 |
| KR | 100721729 B1 | 5/2007 |

* cited by examiner

*Primary Examiner* — Hoa Pham
(74) *Attorney, Agent, or Firm* — Myers Bigel Sibley & Sajovec, P.A.

(57) ABSTRACT

A method for inspecting a uniformity of CD (CD) of a photo mask pattern increases a production yield. The method obtains a CD by precisely measuring a photo mask by using, an electron microscope. Then, a measurement image having, a plurality of patterns formed in the photo mask is obtained by photographing the photo mask at a high speed through an optical microscope. A gray level based on the CD is calculated by capturing just a pattern area in the measurement image, and an estimated value and a correlation coefficient is obtained, when an open density of the measurement image is relatively low. Accordingly, a uniformity of CD can be confirmed more clearly in a measurement of high speed for a measurement image having a relatively low open density.

10 Claims, 8 Drawing Sheets

METHOD FOR INSPECTING CRITICAL DIMENSION UNIFORMITY AT HIGH SPEED MEASUREMENT

CROSS-REFERENCE TO RELATED APPLICATIONS

This application claims priority under 35 U.S.C. §119 from Korean Patent Application 10-2008-0108789, filed on Nov. 4, 2008, the contents of which are hereby incorporated by reference in their entirety as if fully set forth herein.

BACKGROUND

The inventive concept relates to a reliability inspecting method in a high-speed measurement of a fine pattern, and more particularly, a method for inspecting reliability in a high-speed measurement of a fine pattern formed in a photo mask at a high speed.

A design rule of integrated circuits is being reduced to 0.1 micro or below as semiconductor devices are increasingly becoming highly integrated. To produce such semiconductor devices of hyperfine level, various processes are required and margins are increasingly becoming reduced. For example, increasing difficulty in a photolithography processes may cause a serious influence on a wafer due to even small change of a photo mask, and thus an overall investigation for various patterns should be executed on an overall photo mask.

The photo mask undergoes a precise measurement using an electron microscope. However, the photo mask needs to measure by thousands of points or more for the overall photo mask. Meanwhile, an electron microscope SEM is valid to measure just for sampled-pattern at a level of tens of points owing to a speed question. It is also impossible in principle to measure a step coverage or material difference of a photo mask influencing a wafer pattern, an optical difference through an incline of pattern etc., by using an electron microscope.

By such requirement the photo mask is measured at a high speed by using an optical microscope such as an aerial image inspection device. A high-speed measurement method using an optical microscope is to detect a uniformity of a critical dimension (hereinafter, referred to as 'CD') of a photo mask pattern by deciding a repetition section for a repeated pattern and obtaining the sum of images therefor and then performing their relative comparison. However, when an open density of pattern is low in the repetition section, a noise-over-signal rate becomes high, thus there maybe difficulty in inspecting a uniformity of CD of a photo mask.

SUMMARY

Accordingly, some embodiments of the present invention provide a method for inspecting a CD uniformity of photo mask, which is capable of ensuring a high signal in comparison with noise even when an open density of pattern in a repetition section is relatively low, and simply inspecting a CD uniformity of a photo mask pattern, thereby increasing a production yield. The productivity can substantially increase by more precisely performing a measurement of high speed for a photo mask.

According to an embodiment of the present invention, a method for inspecting a uniformity of CD of a photo mask pattern comprises obtaining information for a CD of pattern formed in the photo mask by precisely measuring the photo mask; obtaining a plurality of measurement images having the pattern by photographing the photo mask at a high speed; capturing respective pattern areas provided in the plurality of measurement images; calculating a gray level value of the pattern area; confirming an estimated value corresponding to a change of the gray level value based on the CD of the precision measurement; and confirming the uniformity of the CD at a measurement of high speed by checking a range the gray level value is deviated from the estimated value.

The method may further comprise deciding whether an open density of the measurement image is relatively low, and calculating the estimated value corresponding to the change of the gray level value got being based on the CD of the precision measurement.

The estimated value may be represented as a linear equation, and the uniformity of the CD may be represented as a correlation coefficient.

In embodiments of the present invention, a pattern area is captured in an image measured at a high speed through an optical microscope and thus a high signal in comparison with noise can be ensured, and a uniformity of CD of photo mask can be simply inspected, thereby substantially increasing a production yield.

Productivity can substantially increase by calculating a CD uniformity of a photo mask and more precisely performing a high-speed measurement of a photo mask.

BRIEF DESCRIPTION OF THE DRAWINGS

Embodiments of the present invention will become more fully understood from the detailed description given hereinbelow and the accompanying drawings which are given by way of illustration just, and thus are not limitative of the inventive concept, and wherein.

DETAILED DESCRIPTION OF THE EMBODIMENTS

The present invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to," "coupled to" or "responsive to" another element or layer, it can be directly on, connected, coupled or responsive to the other element or layer or intervening elements or layers may be present. In contrast, when an element is referred to as being "directly on," "directly connected to," "directly coupled to" or "directly responsive to" another element or layer, there are no intervening elements or layers present. Like numbers refer to like elements throughout. As used herein, the term "and/or" includes any and all combinations (mixtures) of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The structure and/or the device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

It should also be noted that in some alternate implementations, the functionality of a given block may be separated into multiple blocks and/or the functionality of two or more blocks may be at least partially integrated.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

A method for inspecting a CD uniformity of a photo mask pattern according to an embodiment of the present invention is described as follows, referring to the accompanying drawings.

Function and method in embodiments are described in detail referring to FIGS. 1 to 8.

Figure 1A:
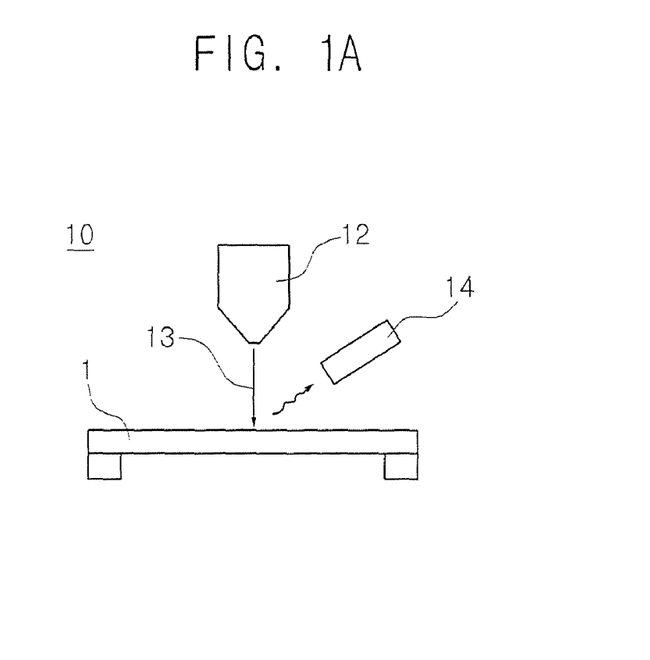
FIGS. 1A and 1B schematically illustrate an electron microscope and an optical microscope.
Figure 1B:
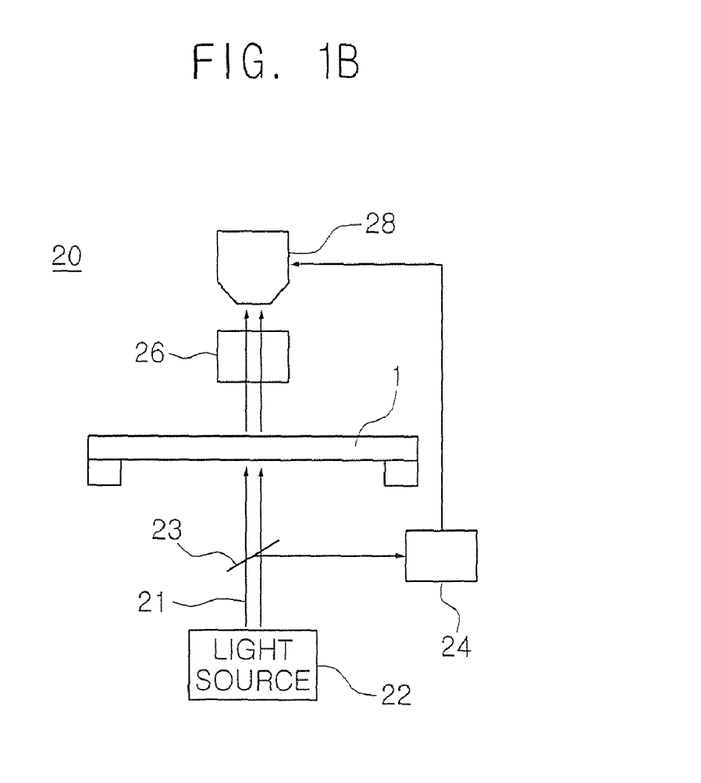

FIGS. 1A and 1B schematically illustrate an electron microscope and optical microscope used in embodiments of the present invention.

As shown in FIGS. 1A and 1B, a photo mask 1 is measured precisely by using an electron microscope 10 to obtain a CD of a pattern of the photo mask 1, and the photo mask 1 is measured at a high speed through an optical microscope 20 to confirm or inspect a uniformity of the pattern CD.

The electron microscope 10 may precisely measure the CD of a pattern formed in the photo mask 1 as an electron beam 13 discharged from an electron source 12 is scattered on the photo mask 1 and then detected by an electron beam detector 14, thereby precisely measuring the CD of the pattern formed in the photo mask 1. For example, the electron microscope 10 may precisely measure the CD of a pattern by scanning an electron beam 13 having a radius of approximately 2~3 nm on the photo mask 1.

The optical microscope 20 can obtain a measurement image by photographing the photo mask 1 by using a sensor 28, i.e., charge coupled device (CCD), using light 21 passing through the photo mask 1 from a light source 22. In the light 21 projected from the light source 22, intensity for a portion of the light is checked through an intensity detector 24 by using a half mirror 23, and the rest light is mostly exposed to the photo mask 1. The intensity of the light 21 detected by the intensity detector 24 may be used as data in an open density calculation of measurement image. The light 21 passing through the photo mask 1 passes through an optical system 26 formed of at least one lens, enlarges and projects the photo mask 1, and is obtained as a measurement image through a sensor 28. For example, the optical microscope 20 exposes the photo mask 1 to laser light 21 having a diameter of approximately $10^1$~$10^2$ μm at a time from several positions, thereby acquiring a large quantity of measurement images sequentially, fast. The optical microscope 20 can measure various parts of the photo mask 1 at a high speed as compared with the electron microscope 10.

In an embodiment of the present invention, a uniformity of CD provided in a measurement image acquired by the optical microscope 20 is inspected by using the CD of the photo mask 1 detected through the electron microscope 10 as reference data.

Figure 2:
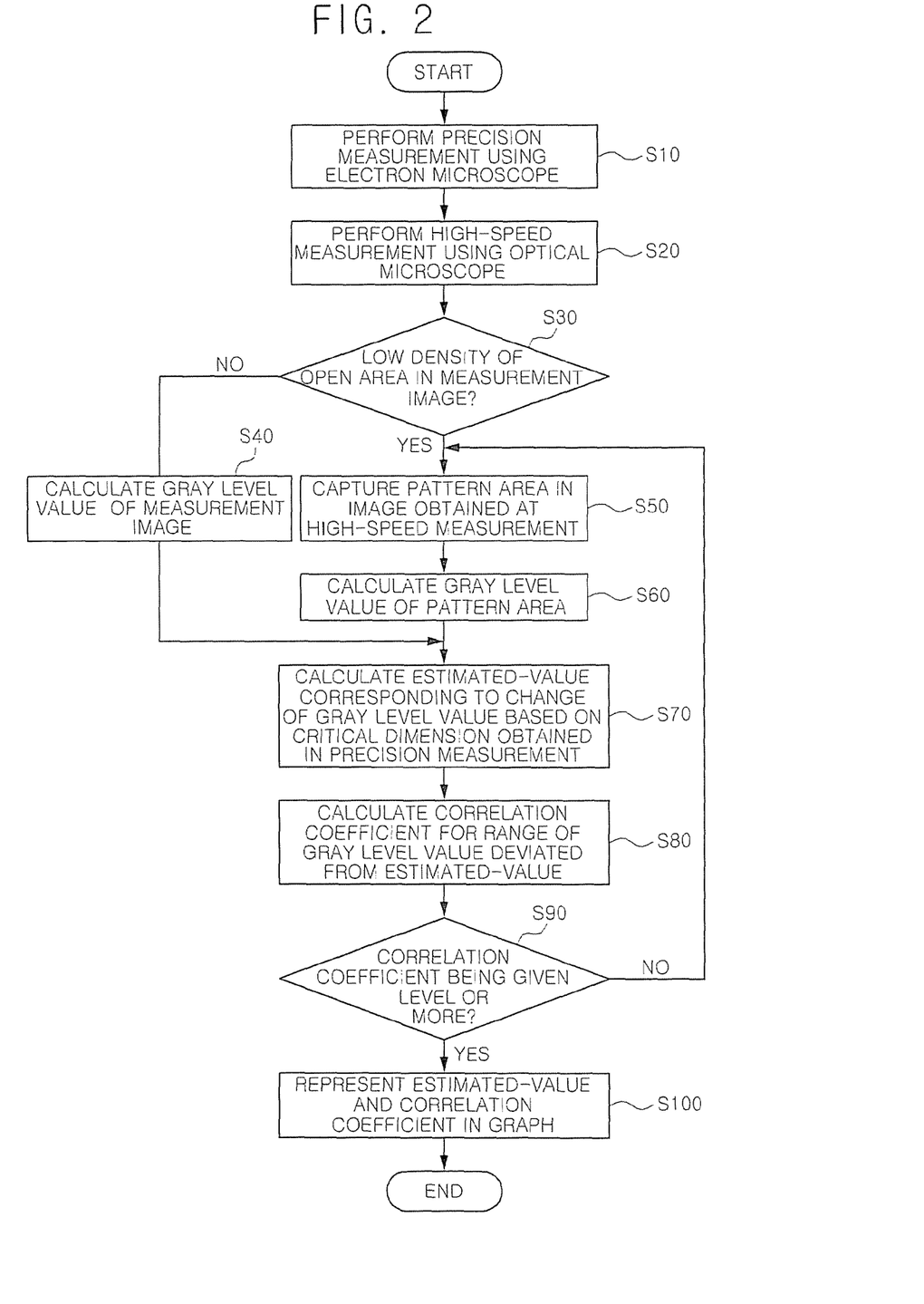
FIG. 2 is a flowchart providing a CD uniformity inspecting method of the photo mask according to an embodiment of the present invention.

FIG. 2 is a flow chart providing a uniformity inspecting method of CD of the photo mask according to an embodiment of the present invention.

Referring to FIG. 2, in the method for inspecting a uniformity of CD of a photo mask according to an embodiment, the photo mask 1 is precisely measured in a step S10, by using electron microscope 10. Various sizes of patterns are formed in the photo mask 1, and the electron microscope 10 can measure the size of pattern. As described above, the electron microscope 10 sequentially measures the patterns formed in the photo mask 1 according to the size, thereby subsequently using the CD as reference data of a measurement image to be measured through the optical microscope 20.

Subsequently, the photo mask 1 is photographed at a high speed by using the optical microscope 20, thus obtaining a measurement image in a step S20. The optical microscope 20 does not individually measure patterns formed in the photo mask 1, but obtains the measurement image by photographing at a time a given number of patterns provided in a corresponding unit area. For example, the optical microscope 20 can obtain the measurement image by photographing a screen of approximately $10^3 \sim 10^5$ μm$^2$ in the size in a stepper type. At this time, the measurement image comprises a plurality of patterns based on a single size within a square shape and is provided as black-and-white.

Accordingly, in the embodiment, a measurement image is obtained by using the optical microscope 20, and a uniformity based on the size of a plurality of patterns represented in the measurement image is confirmed, in place of individually confirming the size of patterns represented in the measurement image.

It is subsequently decided in a step S30 whether or not an open density of measurement image obtained from the optical microscope 20 is relatively low. The open density may be decided as a low or high level from the standard of approximately 0.5. When a pattern of measurement image is relatively large or the number of patterns is relatively many, the open density is high, and when the size of pattern or the number of patterns is relatively small, the open density is low. That is, when the open density is high, a uniformity of the CD using the measurement image can be simply confirmed. In a measurement image having a relatively high open density, a gray level value is immediately calculated in a step S40. The gray level value is a regular value obtained by dividing a light-and-darkness of the measurement image into approximately 256 grades of 0 to 255. This level may be subdivided more in detail depending on the kind of sensors or CCD.

After that, in the measurement image having a relatively high open density, an incline is relatively high in an estimated value of gray level value based on the CD described below, in a step S70, and a correlation coefficient R$^2$ traced to the estimated value is represented as a high level in a step S80, accordingly a worker can decide simply and fast as to whether the photo mask 1 has a defect.

Figure 3:
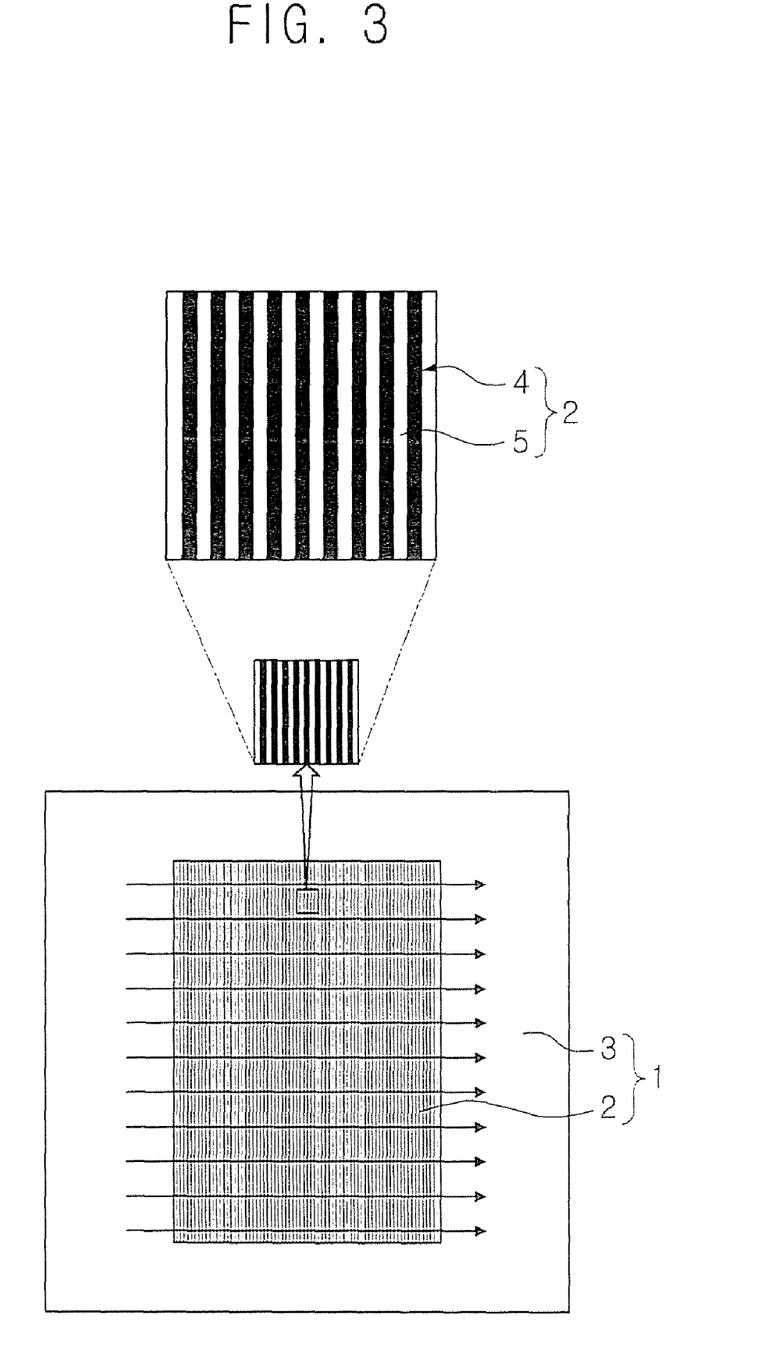
FIG. 3 is a plan view illustrating a photo mask having a relatively high open density.

FIG. 3 is an enlarged plan view illustrating a photo mask 1 having a relatively high open density. With reference to FIG. 3, in the photo mask 1, a central area 2 having a relatively high open density is formed in an outer area 3. The central area 2 is formed of a stripe pattern, and a measurement image indicating the central area 2 is provided with an open density of approximately 0.5. The central area 2 comprises a pattern area 4 having a pattern formation, and a peripheral area 5 formed surrounding the pattern area 4. An arrow shown in the drawing indicates a direction of acquiring a measurement image of the central area 2 while the optical microscope 20 moves.

Figure 4:
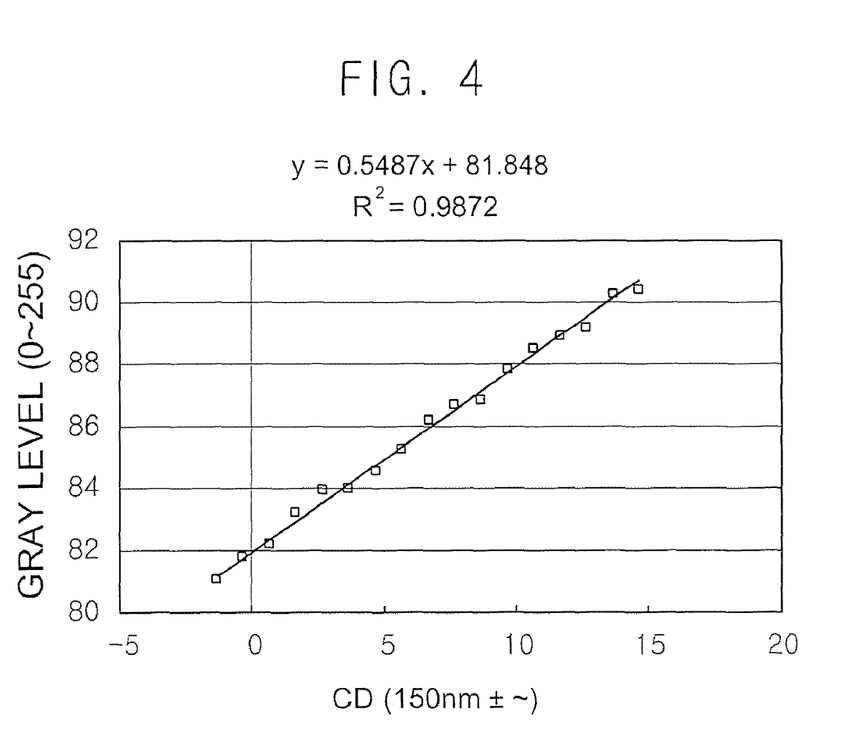
FIG. 4 is a graph providing an open density of FIG. 3 as a gray level value.

FIG. 4 is a graph providing an open density of FIG. 3 through a gray level value. Referring to FIG. 4, the measurement image having a high open density is provided proportionately by an incline having a relatively high gray level value as the CD becomes increased. Here, a transverse axis denotes a CD and a longitudinal axis indicates a gray level value corresponding to an average intensity of an open area. An estimated value corresponding to a change of gray level value based on the CD may be represented as a linear equation of 'y=0.5487x+81.848'. The correlation coefficient R$^2$ is represented relatively very highly as 0.9872, that is, this denotes that the gray level value in the measurement image is well traced to the estimated value.

On the other hand, when the open density is relatively low, it is not simple to confirm a uniformity of CD. In an embodiment of the present invention, therefore, a uniformity of CD in pattern area 4 is confirmed by capturing the pattern area 4 having at least one pattern within the central area 2 of the measurement image.

Figure 5:
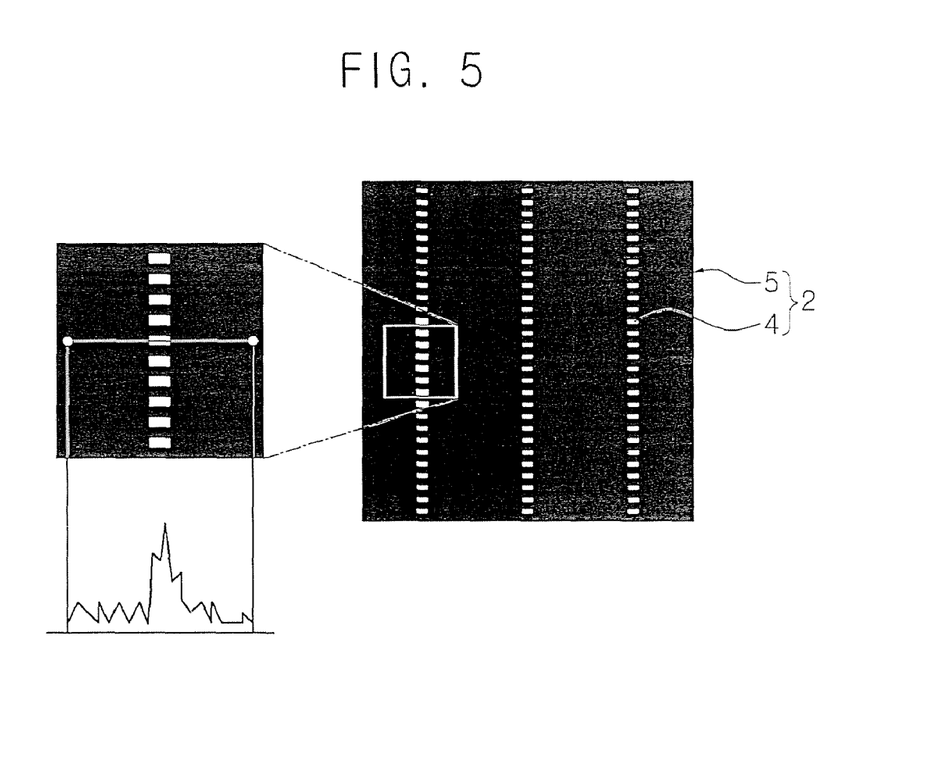
FIG. 5 is an enlarged plan view of photo mask with a relatively low open density.

FIG. 5 is an enlarged plan view of photo mask 1 with a relatively low open density. In a measurement image having a relatively low open density, pattern area 4 is excessively small as compared with peripheral area 5. A peak signal of a light-and-darkness is provided in the pattern area 4, and a noise signal is provided in the peripheral area 5. Here, the measurement image is formed mostly of peripheral area 5 of a black in which the light 21 is cut off, and is formed of a pattern area 4 as the rest through which the light 21 passes.

Figure 6:
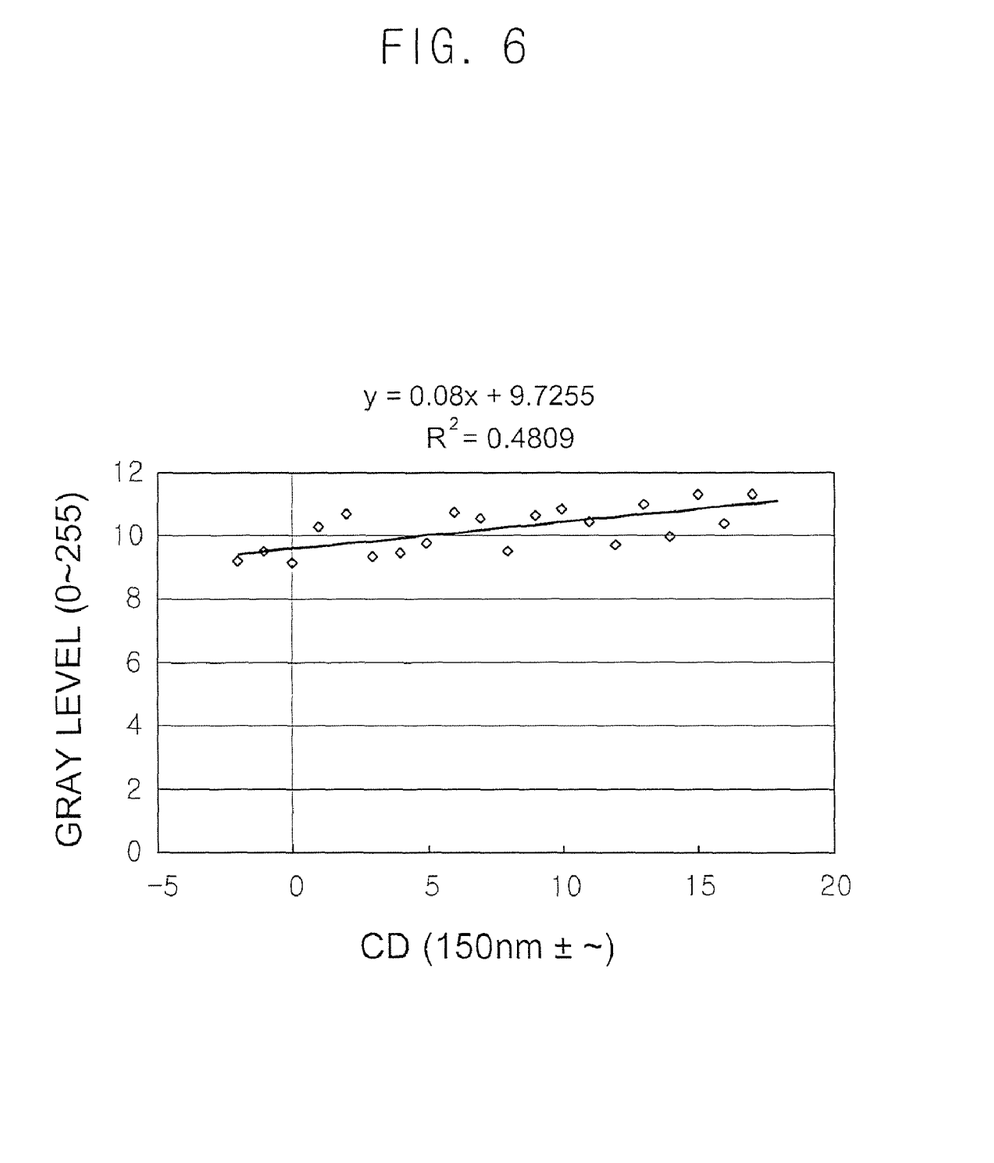
FIG. 6 is a graph of providing, as a gray level value, an open density referred to in FIG. 5.

FIG. 6 is a graph providing, as a gray level value, an open density referred to in FIG. 5. In a measurement image having a relatively low open density, a gray level value is not almost changed or is provided in proportionate to a relatively low incline even when the CD increases. That is, a peak signal of a light-and-darkness corresponding to the pattern area 4 is not distinguished, but is mixed by the noise signal. Here, an estimated value corresponding to a change of gray level value based on the CD may be represented as a linear equation of 'y=0.08x+9.7255'. The correlation coefficient R$^2$ is represented relatively very lowly as 0.4809, that is, this denotes that the gray level value in the measurement image is not well traced to the estimated value. As a result, the measurement image having a low open density may cause a measurement error.

Thus, just the pattern area 4 is captured in the central area 2 of the measurement image with a low open density in a step S50. For example, the capturing of the pattern area 4 may be obtained by removing peripheral area 5 having a noise signal or by selecting pattern area 4 based on a design standard.

First, just pattern area 4 is captured by selecting a peak signal having a level higher than noise signal in the measurement image. Here, the pattern area 4 comprises almost an open area and an adjacent area of the open area. The adjacent area partially contains a noise signal, but may have partially a signal of high level with an influence from a peak signal provided in the open area. For example, the adjacent area contains a portion in which a peak signal having a level higher by approximately 10%~20% than a noise signal is represented. Accordingly, in the embodiment, even when the open density of pattern is relatively low within the repetition section, a peak signal of high level as compared with a noise signal is ensured, and thus a uniformity of CD of the photo mask 1 can be simply inspected.

Figure 7A:
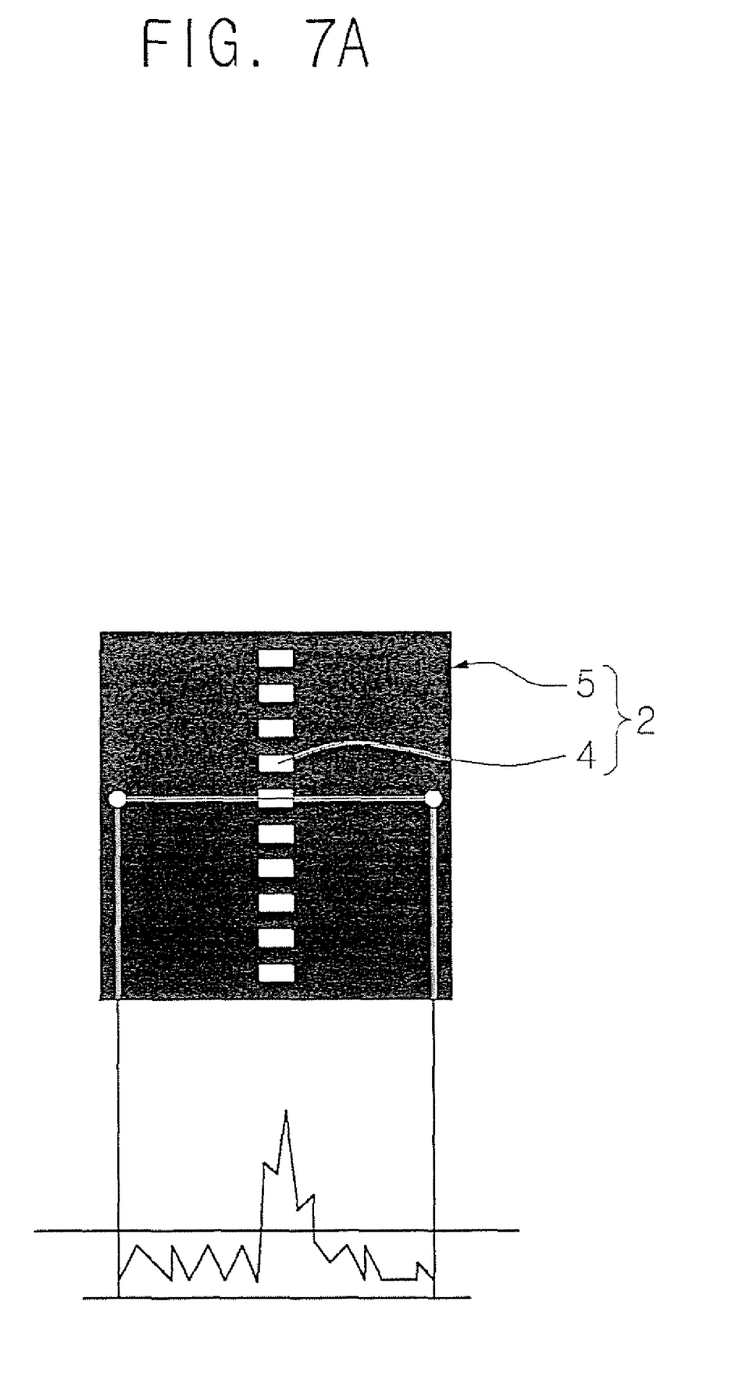
FIGS. 7A and 7B are plan views illustrating a capturing of pattern area in measurement image.
Figure 7B:
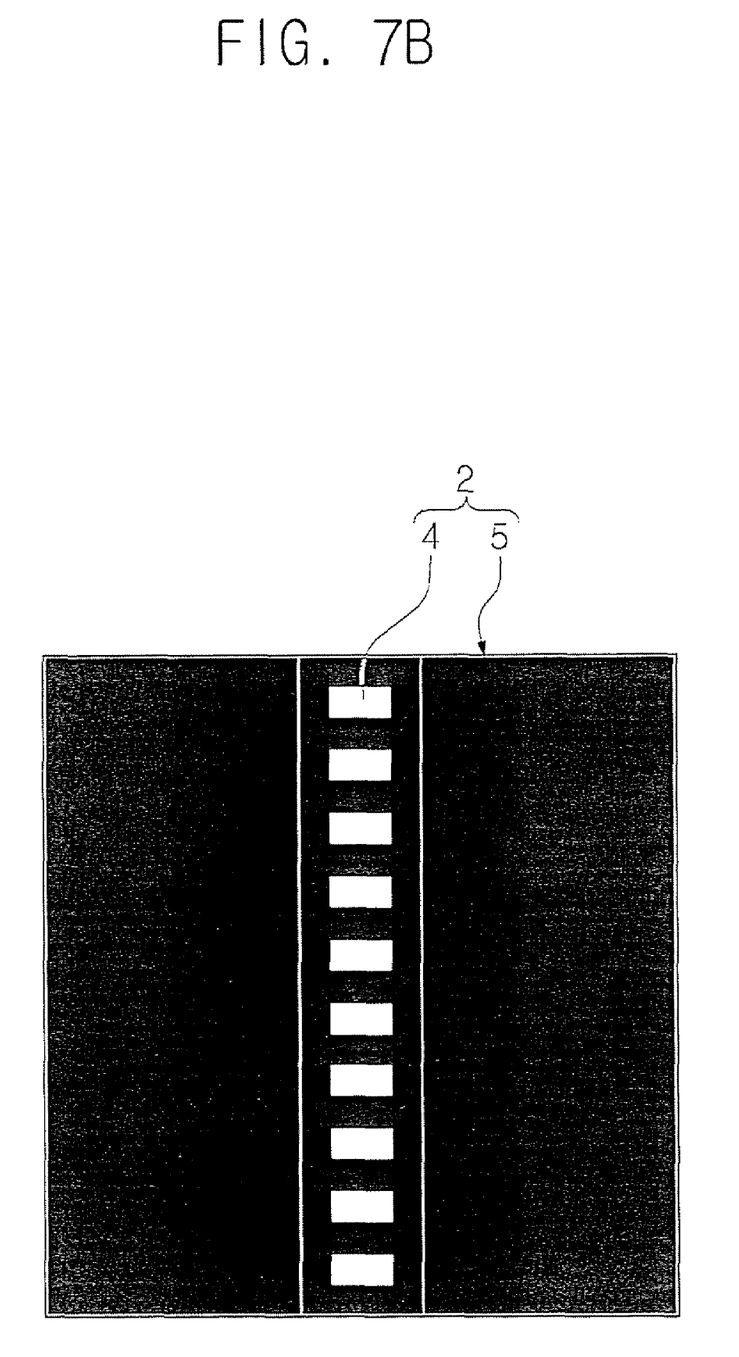

FIGS. 7A and 7B are plan views illustrating a capturing of pattern area 4 in a measurement image. In the drawings, central area 2 of measurement image is formed of pattern area 4 and peripheral area 5. The pattern area 4 may be captured except the peripheral area 5 having a noise signal within the measurement image. Here, the pattern area 4 is an area where a peak signal and a noise signal exist together in the measurement image, and is provided with almost peak signals. For example, in FIG. 7B, the pattern area 4 is captured in a rectangle type in the measurement image. Furthermore, the pattern area 4 may be captured as several shapes since the pattern areas 4 provided in the measurement image may become different from one another.

Accordingly, in the embodiment, a noise signal appearing in the peripheral area 5 is removed by capturing the pattern area 4 having just a peak signal in the measurement image, and thus a gray level value is calculated. The uniformity of CD for the open area formed of just the pattern area 4 having just a peak signal can be detected, thereby increasing a precision of the inspection.

As another method, pattern area 4 provided in an initial design of photo mask 1 may be captured in measurement image. At this time, the pattern area 4 requires information for an area predetermined in the design of the photo mask 1. That is, when a measurement image and a design image of the photo mask 1 accord with each other, the pattern area 4 can be captured in the measurement image according to a predetermined standard.

Then, a gray level value of the captured pattern area 4 is calculated in a step S60. The pattern area 4 has just a peak signal, thus the gray level value is relatively high therein. This is why the gray level value is calculated by using just a peak signal except the peripheral area 5 having a noise signal as described above.

In regularizing that, the gray level value for the overall measurement image may be obtained by dividing a value obtained by adding up the noise signal and the peak signal of the peripheral area 5 and the pattern area 4, by an area. Thus, the gray level value of the overall measurement image having the noise signal and the peak signal is obtained as a low level since a loss is generated in the value divided by the area of the measurement image. However, the gray level value in the pattern area 4 is provided being regarded with just the pattern area 4, regardless of the peripheral area 5 having a noise signal, and thus can have a relatively high value.

An estimated value corresponding to a change of gray level value based on the pattern size obtained in the precision measurement is calculated in a step S70. Here, the pattern may be decided being classified as a relatively smaller size of pattern and a relatively larger size of pattern from the standard of a specific sized. As the size of pattern increases, the open area becomes large, thus the gray level value increases. The estimated value is represented in a linear equation defined as a proportional-relational expression thereof. That is, an estimated value of linear equation is obtained through a proportion of the gray level value based on the CD.

An extent of gray level value deviated from the estimated value is calculated as a correlation coefficient in a step S80. The correlation coefficient $R^2$ may be represented as the following numerical expression 1.

$$R^2 = 1 - SS_{err}/SS_{tot}$$ (Numerical Expression 1)

Here, $SS_{tot}$ is represented as $\Sigma(y_i - y)^2$, and indicates the total dispersion value, and is represented as the sum of $SS_{reg}$ and $SS_{err}$ as the total sum of squares. $SS_{reg}$ is represented as $\Sigma(f_i - f)^2$ as a regression sum of squares. $SS_{err}$ is represented as $\Sigma(y_i - f)^2$ as a sum of squared errors or a residual sum of squares. A correlation coefficient $R^2$ becomes increased when the sum of squared errors becomes decreased, and furthermore, becomes increased when the total dispersion value becomes increased. Therefore, when an extent that the gray level value based on the CD is deviated from an estimated value becomes increased, the correlation coefficient $R^2$ becomes decreased, and when coinciding with the estimated value, the correlation coefficient $R^2$ becomes increased.

Subsequently, a measurement state of the photo mask 1 using the optical microscope 20 is decided according to a value of correlation coefficient in a step S90. When the correlation coefficient $R^2$ has a given level or more, it is decided that a measurement process of the photo mask 1 is dominant, such that a user recognizes a normal manufacture of the photo mask 1 by representing an estimated value and the correlation coefficient $R^2$ in a graph, and thus a photolithography process using the photo mask 1 is performed in a step S100.

On the other hand, when the correlation coefficient $R^2$ is less than a predetermined value, the pattern area 4 captured in the measurement image measured at a high speed through the optical microscope 20 is relatively small.

Figure 8:
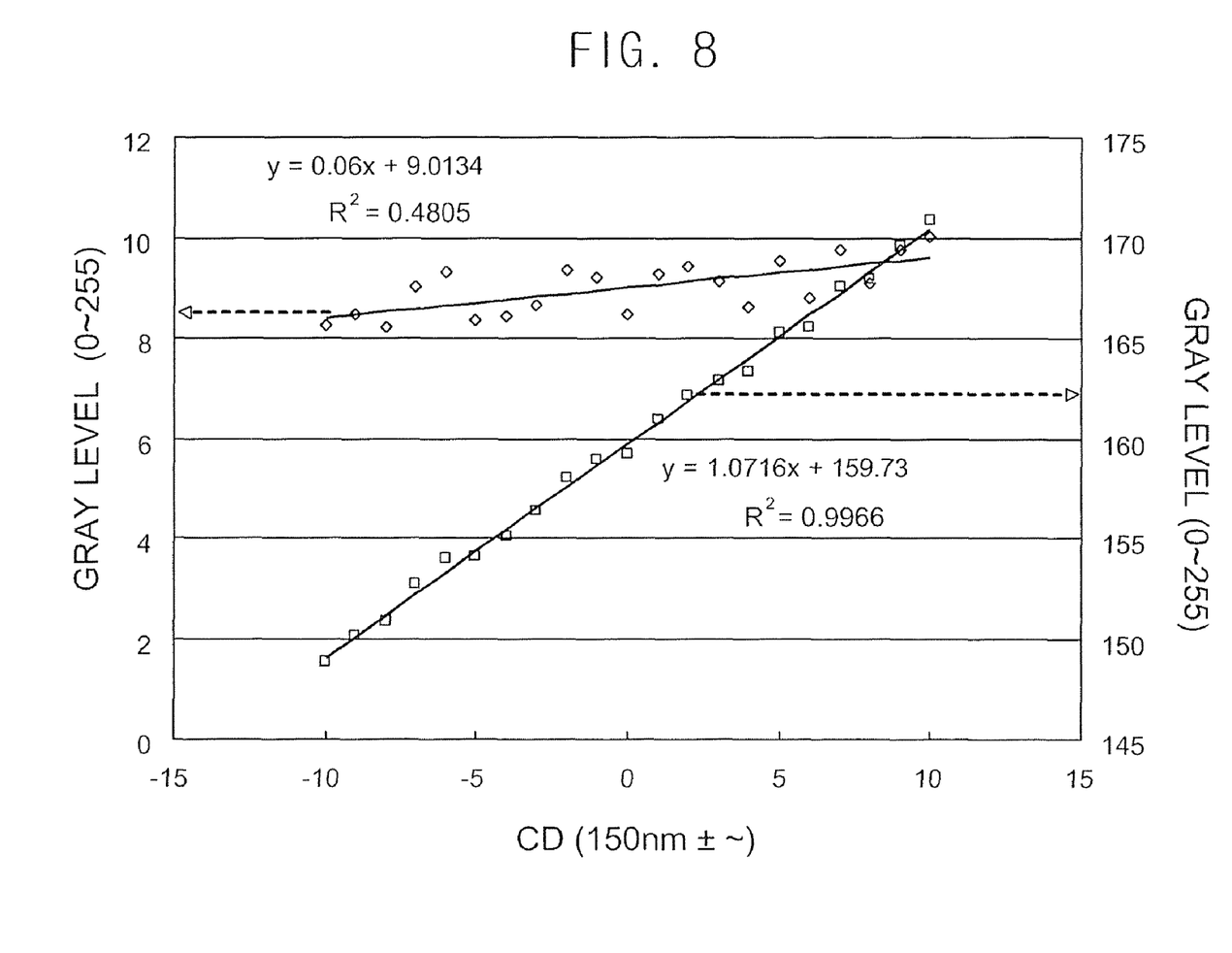
FIG. 8 is a graph got through a comparison of uniformity for a CD containing a noise signal with uniformity for a CD with a removal of noise signal.

FIG. 8 is a graph obtained through a comparison of uniformity for a CD having a noise signal with uniformity for a CD from which a noise signal has been removed. A gray level value of a CD containing a noise signal is provided with a correlation coefficient $R^2$ of approximately 0.4805 traced to an estimated value of 'y=0.06x+9.0134' in 8 to 10. A gray level value of a CD with a removal of noise signal is provided with a correlation coefficient $R^2$ of approximately 0.9966 traced to an estimated value of 'y=1.0716x+159.73' in 150 to 170.

Here, an X-axis indicates the size of pattern with a small size or large size from the standard pattern of approximately 150 nm. For example, when the size of standard pattern is decided as approximately 150 nm, a pattern of 140 nm is provided as −10 nm, and a pattern of 160 nm is provided as +10 nm. A gray level value provided on a y-axis is divided into grades of 0 to 255.

A more prominent uniformity in a CD of photo mask 1 can be acquired, by capturing pattern area 4 with a removal of noise signal in the measurement image and then calculating a gray level value based on a CD, rather than investigating a gray level value based on a CD through use of measurement image intact with a low open density.

Accordingly, in an embodiment of the inventive concept, when an open density of measurement image obtained through optical microscope 20 is relatively small, a gray level value is obtained by capturing just the pattern area 4 from the measurement image and thus an estimated value and a correlation coefficient $R^2$ are calculated, thereby attaining a more precise measurement process as compared with obtaining a gray level value using just a measurement image and increasing reliability in the measurement process.

It will be apparent to those skilled in the art that modifications and variations can be made without deviating from the inventive spirit or scope. Thus, it is intended that the inventive concept cover any such modifications and variations of the inventive concept provided they come within the scope of the appended claims and their equivalents.

In the drawings and specification, there have been disclosed typical embodiments of the inventive concept and, although specific terms are employed, they are used in a generic and descriptive sense just and not for limitation, the inventive scope being set forth in the following claims.

What is claimed is:

1. A method for inspecting uniformity of a critical dimension (CD) of a photo mask pattern, the method comprising:
   obtaining information for the CD of a pattern formed in the photo mask by precisely measuring the photo mask;
   obtaining a plurality of measurement images having the pattern by photographing the photo mask at a high speed:
   capturing respective pattern areas provided in the plurality of measurement images:
   calculating a gray level value of the pattern area;

confirming an estimated value corresponding to a change of the gray level value based on the CD of the precision measurement; and confirming the uniformity of the CD at a measurement of high speed by checking a range the gray level value deviates from the estimated value.

2. The method of claim 1, further comprising deciding whether an open density of the measurement image is relatively low.

3. The method of claim 2, wherein deciding whether an open density of the measurement image is relatively low comprises deciding whether the open density is a high or low level from the standard of 0.5.

4. The method of claim 2, further comprising calculating an estimated value corresponding to the change of the gray level value based on the CD of the precision measurement in the measurement image having a relatively high open density.

5. The method of claim 1, wherein the estimated value is represented as a linear equation.

6. The method of claim 1, wherein the uniformity of the CD is represented as a correlation coefficient.

7. The method of claim 1, wherein the measurement image is classified as the pattern area and a peripheral area.

8. The method of claim 7, wherein the pattern area is obtained by capturing a signal having a level higher than a signal provided as noise on the peripheral area.

9. The method of claim 8, wherein the pattern area is captured in a rectangle.

10. The method of claim 7, wherein the pattern area is obtained by capturing a portion provided as an open area in a design of the photo mask.

* * * * *